(12) United States Patent
Lueders et al.

(10) Patent No.: US 11,716,117 B2
(45) Date of Patent: Aug. 1, 2023

(54) CIRCUIT SUPPORT STRUCTURE WITH INTEGRATED ISOLATION CIRCUITRY

(71) Applicant: TEXAS INSTRUMENTS INCORPORATED, Dallas, TX (US)

(72) Inventors: Michael Lueders, Freising (DE); Giacomo Calabrese, Freising (DE); Nicola Bertoni, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/167,753

(22) Filed: Feb. 4, 2021

(65) Prior Publication Data

US 2021/0258045 A1    Aug. 19, 2021

Related U.S. Application Data

(60) Provisional application No. 63/131,407, filed on Dec. 29, 2020, provisional application No. 62/976,427, filed on Feb. 14, 2020.

(51) Int. Cl.
*H04B 3/00* (2006.01)
*H04B 5/00* (2006.01)
*H01L 21/20* (2006.01)
*H01L 21/50* (2006.01)
*H01L 21/56* (2006.01)
(Continued)

(52) U.S. Cl.
CPC ........... *H04B 5/005* (2013.01); *H04B 5/0093* (2013.01); *H05K 1/162* (2013.01); *H05K 1/165* (2013.01); *H05K 3/4673* (2013.01)

(58) Field of Classification Search
CPC ...... H05K 1/162; H05K 3/4673; H05K 1/165;
H04B 3/00; H04B 5/00; H04B 5/005;
H04B 5/0093; H01L 21/20; H01L 21/50;
H01L 21/56; H01L 21/60; H01L 23/31;
H01L 23/34; H01L 23/48; H01L 23/60;
H01L 23/522; H01L 23/528; H01L 25/00;
H01L 25/0065; H01L 49/02
USPC .......... 174/260; 455/41.1; 257/48, 446, 531,
257/773; 307/104; 375/258, 259, 296,
375/362

See application file for complete search history.

(56) References Cited

U.S. PATENT DOCUMENTS

| | | | |
|---|---|---|---|
| 5,977,530 A * | 11/1999 | Bessho | H02M 3/33571 219/715 |
| 6,876,554 B1 * | 4/2005 | Inagaki | H01L 23/642 257/E23.079 |

(Continued)

*Primary Examiner* — Xiaoliang Chen
(74) *Attorney, Agent, or Firm* — Frank D. Cimino (57) ABSTRACT

A circuit support structure includes a first metal layer, a second metal layer, isolation material containing the first and second metal layers, an isolation circuit, a first plurality of contact pads, and a second plurality of contact pads. The isolation circuit includes a first circuit element in the first metal layer and a second circuit element in the second metal layer and electrically isolated from the first circuit element by the isolation material. The first plurality of contact pads is adapted to be coupled to a first integrated circuit on the circuit support structure and includes a first contact pad electrically coupled to the first circuit element. The second plurality of contact pads is adapted to be coupled to a second integrated circuit on the circuit support structure and includes a second contact pad electrically coupled to the second circuit element.

19 Claims, 9 Drawing Sheets

(51) Int. Cl.

| | |
|---|---|
| H01L 21/60 | (2006.01) |
| H01L 23/31 | (2006.01) |
| H01L 23/34 | (2006.01) |
| H01L 23/48 | (2006.01) |
| H01L 23/60 | (2006.01) |
| H01L 23/522 | (2006.01) |
| H01L 23/528 | (2006.01) |
| H01L 25/00 | (2006.01) |
| H01L 25/065 | (2023.01) |
| H01L 49/02 | (2006.01) |
| H05K 3/46 | (2006.01) |
| H05K 1/16 | (2006.01) |

(56) References Cited

U.S. PATENT DOCUMENTS

| | | | | |
|---|---|---|---|---|
| 6,970,362 | B1* | 11/2005 | Chakravorty | H01L 23/642 257/E23.079 |
| 8,061,017 | B2* | 11/2011 | Fouquet | H04L 25/0266 336/200 |
| 8,525,370 | B2* | 9/2013 | Walley | H04B 5/0037 307/104 |
| 8,999,807 | B2* | 4/2015 | Jiang | H01L 28/10 257/E21.705 |
| 9,035,422 | B2* | 5/2015 | Khanolkar | H01L 28/10 257/531 |
| 10,115,668 | B2* | 10/2018 | Reingruber | H05K 1/0296 |
| 10,340,245 | B2* | 7/2019 | Seol | H01L 24/06 |
| 10,396,044 | B2* | 8/2019 | Nakagawa | H01L 22/12 |
| 10,490,521 | B2* | 11/2019 | Hu | H01L 24/97 |
| 2005/0000729 | A1* | 1/2005 | Iijima | H05K 3/4007 361/764 |
| 2005/0199929 | A1* | 9/2005 | Horikawa | H01L 23/50 257/E23.079 |
| 2005/0269657 | A1* | 12/2005 | Dupuis | H01L 23/66 257/725 |
| 2005/0271147 | A1* | 12/2005 | Dupuis | H01L 23/66 375/258 |
| 2005/0271148 | A1* | 12/2005 | Dupuis | H01L 23/48 375/258 |
| 2005/0271149 | A1* | 12/2005 | Dupuis | H02M 3/33523 375/258 |
| 2005/0272378 | A1* | 12/2005 | Dupuis | H01L 24/49 455/67.15 |
| 2006/0130303 | A1* | 6/2006 | Yamasaki | H05K 1/162 257/E23.079 |
| 2007/0010064 | A1* | 1/2007 | Das | H05K 1/162 257/E21.013 |
| 2007/0010065 | A1* | 1/2007 | Das | H05K 1/162 438/667 |
| 2007/0045815 | A1* | 3/2007 | Urashima | H01L 23/5383 257/E23.079 |
| 2008/0013635 | A1* | 1/2008 | Dupuis | H01L 24/49 375/258 |
| 2008/0025450 | A1* | 1/2008 | Alfano | H02M 3/33523 375/362 |
| 2008/0031286 | A1* | 2/2008 | Alfano | H04L 25/0266 370/535 |
| 2008/0267301 | A1* | 10/2008 | Alfano | H04L 25/0268 375/258 |
| 2008/0290736 | A1* | 11/2008 | Onishi | H02J 50/60 307/107 |
| 2009/0145636 | A1* | 6/2009 | Miki | H05K 3/284 174/255 |
| 2009/0237900 | A1* | 9/2009 | Origuchi | H01L 23/49838 361/763 |
| 2011/0018099 | A1* | 1/2011 | Muramatsu | H05K 1/162 257/532 |
| 2011/0127845 | A1* | 6/2011 | Walley | H02J 50/70 307/104 |
| 2011/0133561 | A1* | 6/2011 | Kanazawa | H01F 27/2804 307/75 |
| 2011/0291702 | A1* | 12/2011 | Kaeriyama | H04L 25/0266 326/62 |
| 2011/0291819 | A1* | 12/2011 | Kaeriyama | H01L 23/50 340/286.01 |
| 2011/0304016 | A1* | 12/2011 | Nakamura | H05K 3/284 257/532 |
| 2012/0007701 | A1* | 1/2012 | Kaeriyama | H04L 5/16 333/24 R |
| 2012/0020419 | A1* | 1/2012 | Kaeriyama | H04L 25/4902 375/259 |
| 2012/0187562 | A1* | 7/2012 | Hisada | H01L 24/41 257/737 |
| 2012/0280407 | A1* | 11/2012 | Do | H01L 21/4832 257/782 |
| 2013/0055052 | A1* | 2/2013 | Kaeriyama | H04B 5/0075 714/799 |
| 2013/0154118 | A1* | 6/2013 | Do | H01L 23/49548 257/E23.06 |
| 2013/0247372 | A1* | 9/2013 | Iijima | H05K 3/4635 29/846 |
| 2013/0259144 | A1* | 10/2013 | Takeda | H04L 25/0266 375/258 |
| 2013/0287141 | A1* | 10/2013 | Kaeriyama | H04L 1/0041 375/258 |
| 2013/0328166 | A1* | 12/2013 | Willkofer | H01L 23/4952 257/531 |
| 2014/0061643 | A1* | 3/2014 | Kaeriyama | H01L 23/528 257/48 |
| 2014/0070420 | A1* | 3/2014 | Sapone | H01L 23/5389 257/773 |
| 2014/0175602 | A1* | 6/2014 | Funaya | H01L 23/49575 438/381 |
| 2014/0273825 | A1* | 9/2014 | Sapone | H01L 23/645 257/664 |
| 2015/0001948 | A1* | 1/2015 | Brauchler | H01L 23/49575 438/109 |
| 2015/0004902 | A1* | 1/2015 | Pigott | H04B 5/0031 455/41.1 |
| 2015/0162395 | A1* | 6/2015 | Funaya | H01L 23/5227 257/531 |
| 2015/0171934 | A1* | 6/2015 | Brauchler | H01L 21/565 455/41.1 |
| 2015/0318245 | A1* | 11/2015 | Uchida | H01L 23/49575 257/531 |
| 2016/0035670 | A1* | 2/2016 | Chen | H01L 23/552 438/107 |
| 2016/0086756 | A1* | 3/2016 | Bang | H01H 50/36 361/160 |
| 2016/0090294 | A1* | 3/2016 | Wachter | H01L 24/97 438/51 |
| 2016/0093570 | A1* | 3/2016 | Watanabe | H01L 23/3107 257/531 |
| 2016/0197066 | A1* | 7/2016 | Uchida | H01L 21/31058 438/3 |
| 2016/0276277 | A1* | 9/2016 | Syu | H01L 23/49811 |
| 2016/0307868 | A1* | 10/2016 | Tan | H01L 24/73 |
| 2017/0062332 | A1* | 3/2017 | Kuwajima | H01L 23/5227 |
| 2017/0148732 | A1* | 5/2017 | Kuwajima | H01L 24/48 |
| 2017/0178787 | A1* | 6/2017 | Massolini | B22F 7/06 |
| 2017/0231094 | A1* | 8/2017 | Blackshear | H05K 1/185 |
| 2017/0287872 | A1* | 10/2017 | Shen | H01L 23/367 |
| 2017/0373035 | A1* | 12/2017 | Seol | H01L 24/06 |
| 2018/0122772 | A1* | 5/2018 | Kim | H01L 23/3128 |
| 2018/0122789 | A1* | 5/2018 | Kang | H01L 21/4857 |
| 2018/0247905 | A1* | 8/2018 | Yu | H01L 25/50 |
| 2018/0366409 | A1* | 12/2018 | Kuwabara | H01L 23/645 |
| 2019/0006283 | A1* | 1/2019 | Wang | H01L 21/486 |
| 2019/0006309 | A1* | 1/2019 | Jeng | H01L 25/0652 |
| 2019/0131287 | A1* | 5/2019 | Huang | H01L 21/50 |
| 2019/0139902 | A1* | 5/2019 | Lee | H01L 21/561 |
| 2019/0148301 | A1* | 5/2019 | Huang | H01L 23/49838 257/774 |
| 2019/0244905 | A1* | 8/2019 | Yu | H01L 25/0652 |
| 2019/0295944 | A1* | 9/2019 | Kwon | H01L 21/568 |
| 2019/0295972 | A1* | 9/2019 | Tsai | H01L 21/4857 |
| 2020/0020657 | A1* | 1/2020 | Lai | H01L 23/3128 |
| 2020/0051917 | A1* | 2/2020 | Kataoka | H01L 24/09 |

(56) References Cited

U.S. PATENT DOCUMENTS

| | | | |
|---|---|---|---|
| 2020/0118984 A1* | 4/2020 | Chen | H01L 21/6835 |
| 2020/0176416 A1* | 6/2020 | Ketterson | H01L 21/565 |
| 2020/0176990 A1* | 6/2020 | Bhat | H02J 50/70 |
| 2020/0219861 A1* | 7/2020 | Kamgaing | H03H 9/0561 |
| 2020/0287520 A1* | 9/2020 | Kamgaing | H03H 9/1014 |
| 2020/0373243 A1* | 11/2020 | Jang | H01L 23/5389 |

* cited by examiner

CIRCUIT SUPPORT STRUCTURE WITH INTEGRATED ISOLATION CIRCUITRY

CROSS REFERENCE TO RELATED APPLICATIONS

This application claims priority to U.S. Provisional Patent Application No. 62/976,427 filed Feb. 14, 2020 and U.S. Provisional Patent Application No. 63/131,407 filed Dec. 29, 2020, which are incorporated herein by reference.

TECHNICAL FIELD

This relates generally to circuit support structures, and more particularly to a circuit support structure with integrated isolation circuitry.

BACKGROUND

Isolation is often desirable for interconnecting electrical systems to exchange data or power between the systems. For example, two systems may be powered by different supply sources that do not share a common ground connection. The two systems may be electrically isolated to prevent current and voltages in one system from negatively impacting the other system, for instance by damaging or interfering with the operation of one or more components of the other system. Transformer and capacitor isolation are two approaches that are used. Transformer isolation may be used to exchange power between two systems, and capacitor-based isolation may be used to exchange power or data between the two systems. In some applications that use isolation circuits, challenges may arise with respect to maintaining voltage isolation, interconnection parasitics, and isolation circuitry efficiency.

SUMMARY

Described examples include circuit support structures and an integrated circuit package having integrated isolation circuitry. Described examples also include a method for making a circuit support structure having integrated isolation circuitry. Integrating or embedding the isolation circuitry into the circuit support structure allows for a smaller integrated circuit package while maintaining voltage isolation. Moreover, additional benefits such as improved efficiency of the isolation circuitry, reduced interconnection parasitics, and improved thermal performance may be realized when implementing one or more examples as described herein.

In one example, a circuit support structure includes a first metal layer, a second metal layer, isolation material containing the first and second metal layers, an isolation circuit, a first plurality of contact pads, and a second plurality of contact pads. The isolation circuit includes a first circuit element in the first metal layer and a second circuit element in the second metal layer and electrically isolated from the first circuit element by the isolation material. The first plurality of contact pads is adapted to be coupled to a first integrated circuit on the circuit support structure and includes a first contact pad electrically coupled to the first circuit element. The second plurality of contact pads is adapted to be coupled to a second integrated circuit on the circuit support structure and includes a second contact pad electrically coupled to the second circuit element.

In another example, a circuit support structure includes a first metal layer, a second metal layer, mold compound containing the first and second metal layers and defining a mounting surface of the circuit support structure, an isolation circuit, a first plurality of contact pads, and a second plurality of contact pads. The isolation circuit includes a first circuit element in the first metal layer and a second circuit element in the second metal layer and electrically isolated from the first circuit element by the mold compound. The first plurality of contact pads is exposed at the mounting surface and includes a first contact pad electrically coupled to the first circuit element. The second plurality of contact pads is exposed at the mounting surface and includes a second contact pad electrically coupled to the second circuit element.

In another example, an integrated circuit package includes a circuit support structure, a first integrated circuit, and a second integrated circuit. The circuit support structure includes a first metal layer, a second metal layer, isolation material containing the first and second metal layers, an isolation circuit, a first plurality of contact pads, and a second plurality of contact pads. The isolation circuit includes a first circuit element in the first metal layer and a second circuit element in the second metal layer and electrically isolated from the first circuit element by the isolation material. The first plurality of contact pads includes a first contact pad electrically coupled to the first circuit element. The second plurality of contact pads includes a second contact pad electrically coupled to the second circuit element. The first integrated circuit is on the circuit support structure and electrically coupled to the first plurality of contact pads, and the second integrated circuit is on the circuit support structure and electrically coupled to the second plurality of contact pads.

In another example, a method of making a circuit support structure having integrated isolation circuitry includes forming, in metal layers, first and second circuit elements of isolation circuitry, a first plurality of contact pads including a first contact pad, a second plurality of contact pads including a second contact pad, and a third plurality of contact pads. The method also includes coupling the first contact pad to the first circuit element, coupling the second contact pad to the second circuit element, and coupling some of the first plurality of contact pads and some of the second plurality of contact pads to the third plurality of contact pads. The method also includes encapsulating the metal layers in isolation material such that the first and second circuit elements are electrically isolated from each other, the first plurality of contact pads and the second plurality of contact pads are exposed at a first surface defined by the isolation material, and the third plurality of contact pads is exposed at a second opposing surface defined by the isolation material.

DETAILED DESCRIPTION OF EXAMPLE EMBODIMENTS

In the drawings, like reference numerals refer to like elements throughout, and the various features are not necessarily drawn to scale. In the description and in the claims, the terms "including" and "having" and variants thereof are intended to be inclusive in a manner similar to the term "comprising" unless otherwise noted. In addition, the terms "couple", "coupled" or "couples" means an indirect or direct electrical or mechanical connection.

Figure 1:
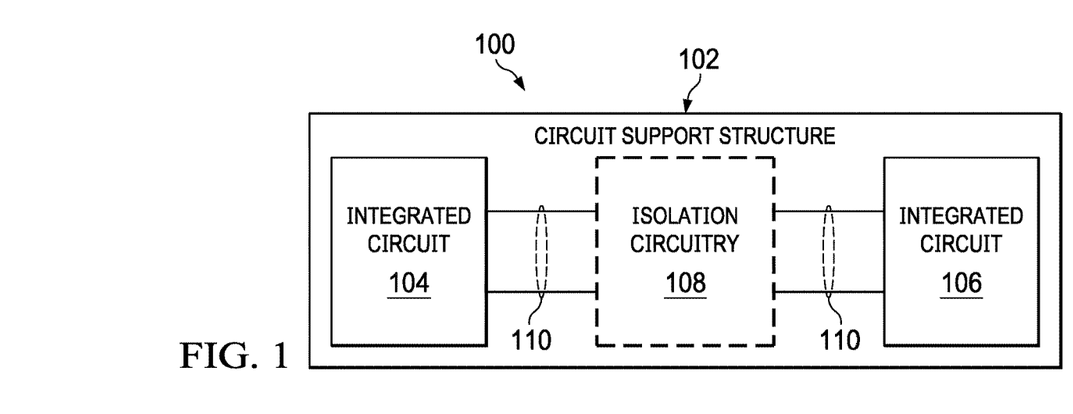
FIG. 1 is a block diagram depicting an example IC package having integrated isolation circuitry.

Referring initially to FIG. 1, which is a block diagram depicting an example IC package 100 having integrated isolation circuitry 108. The IC package 100 includes a circuit support structure 102, an IC 104, and an IC 106. ICs 104 and 106 are mounted to the circuit support structure 102. As used herein, an IC is circuitry built on a semiconductor substrate, such as a silicon wafer. A circuit support structure, such as a lead frame, is a structure that is configured to allow the mounting thereon of an IC and is configured to provide electrical interconnectivity between the IC and one or more circuits external to the circuit support structure.

In accordance with one or more examples of this description, the isolation circuitry 108 is integrated, formed, or embedded into layers (not shown) of the circuit support structure 102, as indicated by dashed lines. Moreover, in further accordance with one or more examples of this description, the circuit support structure 102 includes contact pads (not shown) and may include metallic interconnects 110 (four shown) to allow interconnectivity between the ICs 104 and 106 and the isolation circuitry 108. Each interconnect 110 may represent one or more electrical traces and/or vias.

The isolation circuitry 108 (and other isolation circuitry examples in accordance with this description) may provide a galvanic isolation barrier between two different power domains. In an example, the integrated circuit package 100 represents a direct current (DC)-to-DC converter having a transformer as the isolation circuitry 108. Accordingly, IC 104 may include circuitry, such as a half-bridge circuit or a full-bridge circuit and a driver circuit, for providing a voltage from other circuitry to a primary winding of the transformer. In an example, the voltage is provided from a power supply for a printed circuit board (PCB) on which the circuit support structure 102 is mounted. The PCB may be used to power a device such as a motor or a computing device. IC 106 may include a bridge circuit and a driver and regulation circuit for receiving a voltage from a secondary winding of the transformer and providing one or more regulated output voltages or currents for use by a load on the PCB. The load may be an application-specific integrated circuit or a field-programmable gate array. In other examples, the ICs 104 and/or 106 may represent controller circuitry, current and voltage sensors, gate drivers for insulated-gate bipolar transistors, etc.

The isolation circuitry 108 may include one or more isolation circuits. In one example, the isolation circuitry 108 includes a single transformer, for instance as shown in FIGS. 3-10. In another example, the isolation circuitry 108 includes a single capacitor. However, in other examples, the isolation circuitry 108 includes multiple transformers, multiple capacitors, or a combination of one or more transformers and capacitors, for instance as shown in FIGS. 2 and 11.

Figure 2:
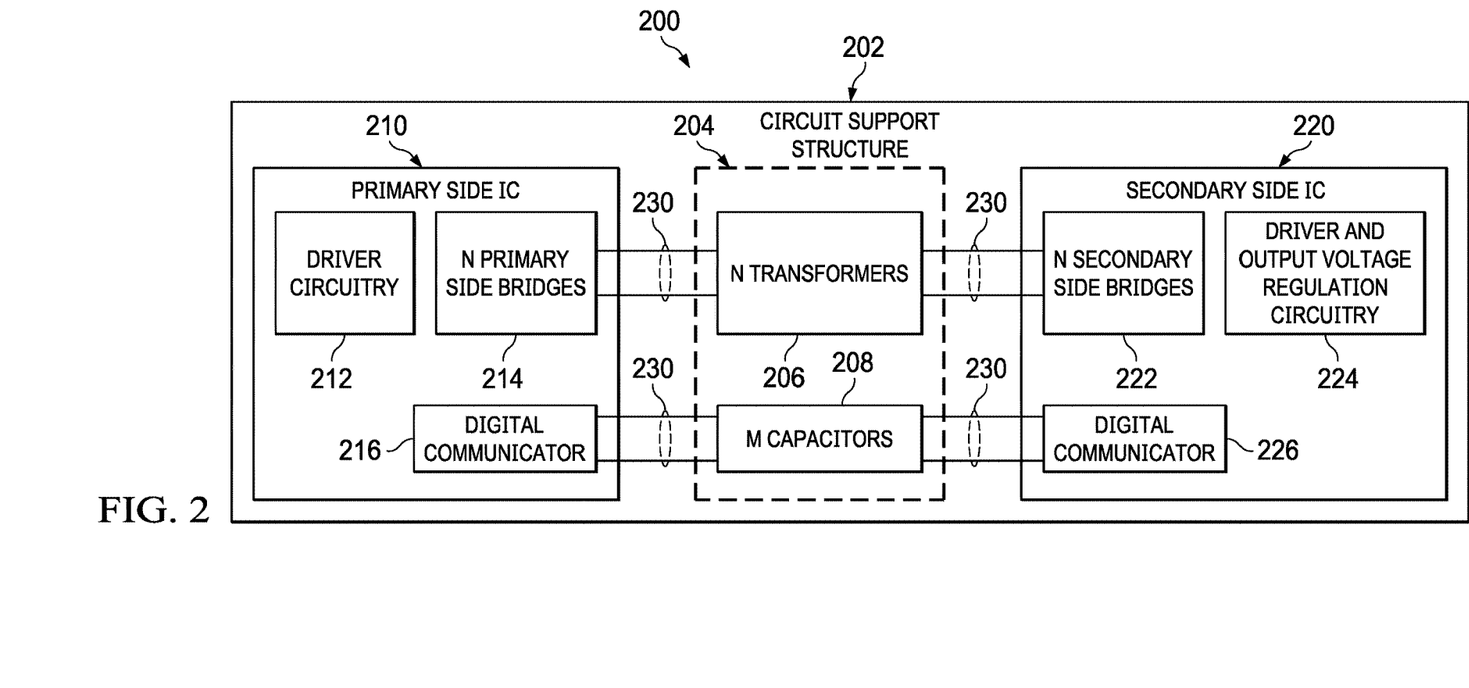
FIG. 2 is a block diagram depicting another example IC package having integrated isolation circuitry including inductive and capacitive isolation channels.

FIG. 2 is a block diagram depicting another example IC package 200 having integrated isolation circuitry 204. The IC package 200 includes a circuit support structure 202, an IC 210, and an IC 220. ICs 210 and 220 are mounted to the circuit support structure 202. The isolation circuitry 204 is integrated into layers (not shown) of the circuit support structure 202, as indicated by dashed lines. Moreover, the circuit support structure 202 includes contact pads (not shown) and metallic interconnects 230 (eight shown) to allow interconnectivity between the ICs 210 and 220 and the isolation circuitry 204. Each interconnect 230 may represent one or more electrical traces and/or vias.

In this example, isolation circuitry 204 includes both transformers and capacitors. Namely, isolation circuitry 204 includes N transformers 206 and M capacitors 208, where both N and M are integer values of one or more. Moreover, N and M may be the same or a different integer value. In another example, the isolation circuitry 204 includes multiple transformers and no capacitors, which may be used to communicate power. In yet another example, the isolation circuitry 204 includes multiple capacitors and no transformer, which may be used to communicate data, power, or a combination of both.

IC 210 is depicted as a primary side IC. Accordingly, IC 210 is electrically coupled to a primary winding (not shown) of each of the N transformers 206. Correspondingly, IC 220 is depicted as a secondary side IC, which is electrically coupled to a secondary winding (not shown) of each of the N transformers 206.

As illustrated, IC 210 includes driver circuitry 212, N primary side bridges 214, and a digital communicator 216. Any suitable circuit configuration may be used for the driver circuitry 212, primary side bridges 214, and digital communicator 216. Each of the N primary side bridges 214 is electrically coupled to the primary winding (not shown) of a respective one of the N transformers 206 by a respective interconnect 230 of the circuit support structure 202. The driver circuitry 212 provides a control function to the primary side bridges 214. In turn, each of the primary side bridges 214 provides a voltage to a respective one of the N transformers 206 using a respective one of the interconnects 230. The current example includes two primary side bridges 214 and two transformers 206, as illustrated by the two interconnects 230 coupled therebetween.

The current example further includes two capacitors 208, as illustrated by the two interconnects 230 coupled between the digital communicator 216 and the capacitors 208. The two capacitors 208 and interconnects 230 allow bidirectional data communication, for example controller area network (CAN) or CAN flexible data rate (FD) protocol communication or RS-485 protocol communication. Namely, the digital communicator 216 may provide a data signal to one of the two capacitors 208 and receive a data signal from the other capacitor 208 over respective interconnects 230.

As further illustrated, IC 220 includes N secondary side bridges 222, driver and output voltage regulation circuitry 224, and a digital communicator 226. Any suitable circuit configuration may be used for the secondary side bridges 222, driver and output voltage regulation circuitry 224, and digital communicator 226. Each of the N secondary side bridges 222 is electrically coupled to the secondary winding (not shown) of a respective one of the N transformers 206 by a respective interconnect 230 of the circuit support structure 202. Driver circuitry of the circuitry 224 provides a control function to the secondary side bridges 222. In turn, each of the secondary side bridges 222 receives a voltage from a respective one of the N transformers 206 using a respective one of the interconnects 230. An output voltage regulator of the circuitry 224 receives and regulates the voltage from the secondary side bridges 222, for instance using a feedback loop. The current example includes two secondary side brides 222 and two transformers 206, as illustrated by the two interconnects 230 coupled therebetween.

The current example further includes two capacitors 208, as illustrated by the two interconnects 230 coupled between the digital communicator 226 and the capacitors 208. The two capacitors 208 and interconnects 230 allow bidirectional data communication. Namely, the digital communicator 226 may provide a data signal to one of the two capacitors 208 and receive a data signal from the other capacitor 208 over respective interconnects 230.

Figure 3:
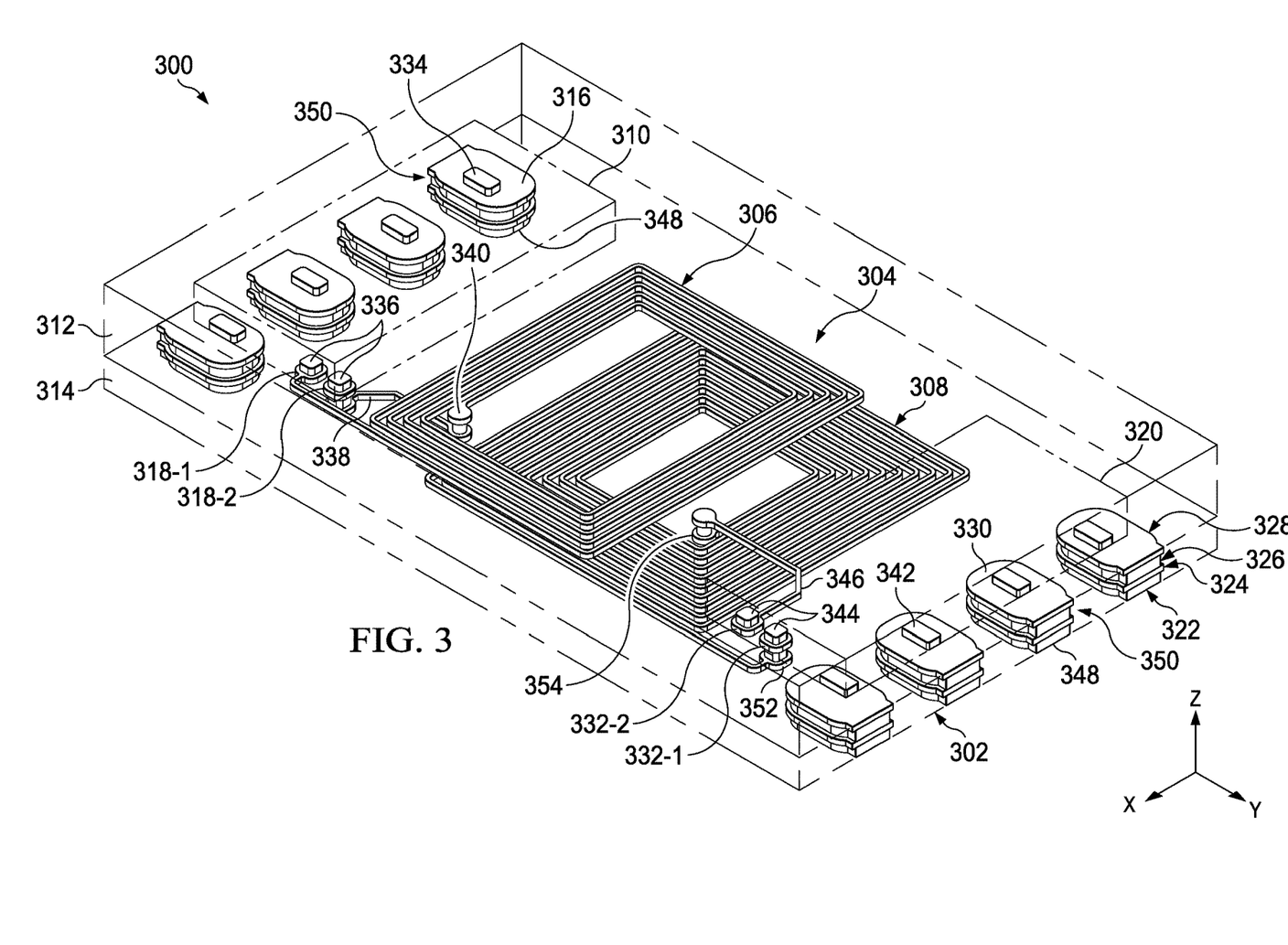
FIG. 3 is an isometric view of an example IC package having integrated isolation circuitry including an inductive channel coupled within the IC package without the use of wire bonding.
Figure 4:
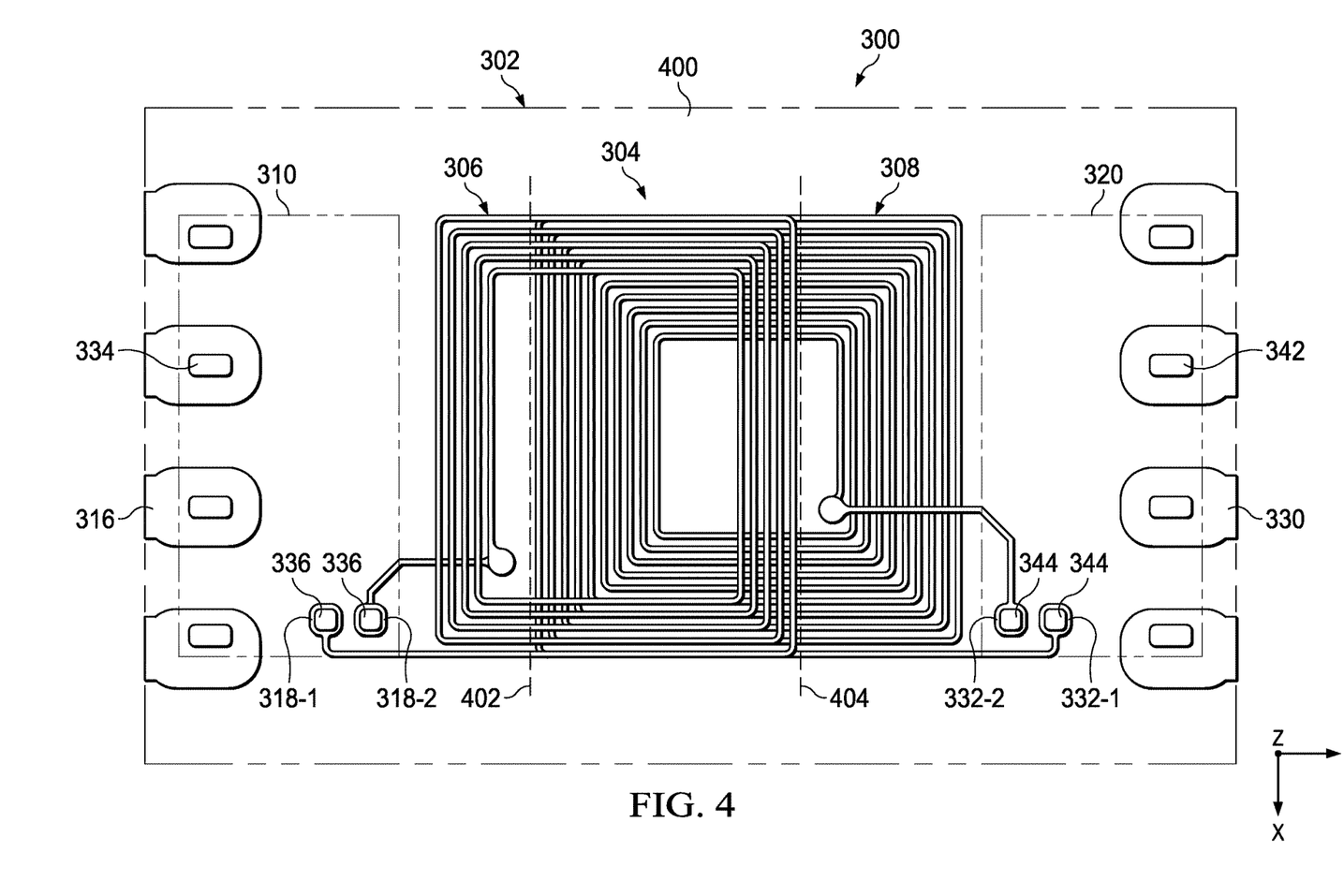
FIG. 4 is a top down plan view of the example IC package shown in FIG. 3.
Figure 5:
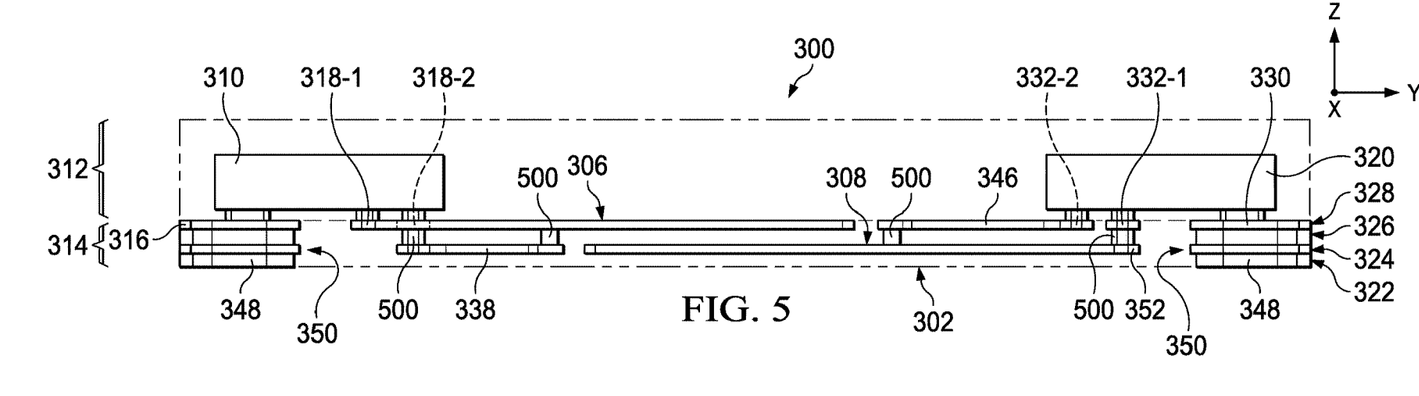
FIG. 5 is a side view of the example IC package shown in FIG. 3.

FIGS. 3-5 illustrate different views of an example IC package 300 having integrated isolation circuitry 304, according to this description. More particularly, FIG. 3 is an isometric view of the IC package 300 along XYZ axes. FIG. 4 is a top down plan view of IC package 300 along the XY axes, and FIG. 5 is a side view of IC package 300 along the YZ axes.

As illustrated, IC package 300 includes a circuit support structure 302 and two ICs 310 and 320 mounted to a surface (400 in FIG. 4) of the circuit support structure 302. In an example, IC 310 includes driver circuitry and a primary side bridge circuit, and IC 320 includes a secondary side bridge circuit and driver/output voltage regulation circuitry, for instance as described previously by reference to FIG. 2. The IC package 300 further includes a mold compound 312 that encapsulates the ICs 310 and 320 and the surface 400 of the circuit support structure 302. The mold compound 312 may have any suitable form such as a bulk mold compound, a sheet mold compound, an insulation build-up film, etc. In this example, IC package 300, including the circuit support structure 302 and ICs 310 and 320, is or forms a flat no-leads package, in particular a dual-flat no-leads (DFN) package. In another example, contact pads 348 used to mount IC package 300 to an external circuit support structure are arranged such that IC package 300 forms a quad-flat no-leads (QFN) package.

The circuit support structure 302 is constructed to include metal layers 322-328 and isolation material 314 containing or encapsulating the metal layers 322-328. In an example, the multi-layer circuit support structure 302 is made using routable lead frame technology. A metal layer, as used herein, is a layer of metal within which is formed metallic elements of a circuit support structure such as contact pads, vias, electrical traces, a thermal/ground pad, and circuit elements of isolation circuitry. Metal layers are positioned in substantially parallel planes to one another and are substantially planar within allowable tolerances as defined by the technology used to make the circuit support structure. Any suitable metal may be used to form the metal layers, such as copper, aluminum, and gold. The circuit support structure 302, in this example, includes four metal layers 322-328. However, other example circuit support structures may include more or fewer metal layers.

Isolation material 314 is used to electrically isolate the metal layers 322-328 and may, thereby, include a dielectric or insulator. Isolation material 314 fully contains some of the metal layers 322-328 and partially contains other of the metal layers 322-328. Partially containing a metal layer includes, for instance, when contact pads formed in a metal layer are exposed at a surface of the circuit support structure 302. Moreover, isolation material 314 defines a mounting or top surface 400 and an opposing or bottom surface (not shown) to the mounting surface 400. In an example, the isolation material 314 is a mold compound having any suitable form such as a bulk mold compound, a sheet mold compound, an insulation build-up film, etc., and may be or include the same or a different type of mold compound as mold compound 312. In a particular example, isolation material 314 is composed of Ajinomoto build-up film (ABF). Other isolation materials may be used, such as ceramic or a fiberglass-based material, but may not provide similar performance to the mold compound as detailed later.

As further illustrated in FIG. 3, the circuit support structure 302 also includes isolation circuitry 304, which is formed and integrated therein. In this example, isolation circuitry 304 includes a single transformer having a winding 306 (e.g., a primary winding) as a first circuit element and a winding 308 (e.g., a secondary winding) as a second circuit element. Accordingly, isolation circuitry 304 is also referred to herein as transformer 304. In another example, isolation circuitry 304 may include a single capacitor having a first set of one or more plates as a first circuit element and a second set of one or more plates as the second circuit element integrated into the circuit support structure 302.

Windings 306 and 308 are formed in different ones of the metal layers 322-328 as further described below and illustrated by reference to FIG. 5. Moreover, windings 306 and 308 are electrically isolated using the isolation material 314 of the circuit support structure 302, which in one particular example forms a galvanic isolation barrier between two different power domains. In this particular example, IC 310 would be powered using a voltage supply and ground connection associated with a first power domain. IC 320 would be powered using a different voltage supply and ground connection associated with a second power domain. Moreover in a further example, the isolation material 314, e.g., the mold compound, has a thickness and is a type that provides a galvanic isolation barrier that withstands 5 kilovolts (kV) root mean square (RMS) for 60 seconds in one example and 2.5 kV RMS for 60 seconds in another example. However, different isolation ratings may be achievable based at least in part on the type and thickness of the isolation material 314 used.

Using a mold compound as the isolation material 314, instead of a laminate, allows for a smaller critical separation between windings 306 and 308 while maintaining the same voltage insulation and also allows for improved thermal performance of the isolation circuitry 304. Also, making the circuit support structure 302 using routable lead frame technology allows for thicker copper traces (e.g., 30-35 micrometers or thicker, for instance 1%, 5%, or 10% thicker) and smaller metal width and spacing (e.g., 30×30 micrometers$^2$ or less, for instance 1%, 5%, or 10% less). This may lead to an improved efficiency of the transformer 304 by allowing an increased quality factor for the transformer 304. Also, integrating the transformer 304 into the circuit support structure 302 allows for smaller IC package sizes (e.g., 5.0×3.0×0.8 millimeters$^3$ or less, for instance 1%, 5%, or 10% less).

As used herein, critical separation means one or more minimum distances taken between first and second circuit elements (e.g., primary and secondary windings or first and second capacitor plates) of an isolation circuit that allows a given isolation rating to be achieved without a voltage breakdown of the isolation material between the first and second circuit elements. Accordingly, by using different types of isolation material 314, e.g., different types of mold compounds individually or in combination, the critical separation between windings 306 and 308 can be adjusted, for instance to meet desired creepage and clearance for the IC package 300 and to achieve lower creepage and clearance than achievable using laminate as isolation material.

The circuit support structure 302 includes a first plurality of contact pads 316 (one of four labeled) and 318 (individually referred to as contact pads 318-1 and 318-2) for coupling to IC 310. The circuit support structure 302 further includes a second plurality of contact pads 330 (one of four labeled) and 332 (individually referred to as contact pads 332-1 and 332-2) for coupling to IC 320. More particularly, the contact pads 316, 318, 330, and 332 are formed in metal layer 328 (e.g., a top metal layer) and are exposed at mounting surface 400 of the circuit support structure 302 for coupling to ICs 310 and 320. Contact pads 316, 318, 330, and 332 are, thereby, also referred to herein as IC contact pads as they are used for mounting or securing and electrically coupling ICs 310 and 320 to the circuit support structure 302.

Contact pads 316 and 330 are electrically coupled to contacts pads 348 (two of eight labeled), which are formed in metal layer 322 (e.g., a bottom metal layer) and exposed at a bottom surface (not shown) of the circuit support structure 302. In a DFN or QFN implementation of the IC package 300, for instance, the bottom metal layer 322 may also have formed therein a ground/thermal plane to allow improved thermal performance of the IC package 300.

In this example, the mounting surface 400 and the opposing bottom surface are substantially flat or planar and are substantially parallel to one another within allowable tolerances of the technology used to make the circuit support structure 302. The electrical coupling between contact pads 316 and 348 and between contact pads 330 and 348 is implemented using vias 350 (two of eight labeled) formed in intervening metal layers 324 and 326 and formed through the isolation material 314. Accordingly, contact pads 348 may be used to mount and electrically couple IC package 300 to an external circuit support structure, such as a laminate PCB.

Contact pads 318 and 332 are electrically coupled to transformer 304. As shown, contact pad 318-1 forms a first input voltage terminal for winding 306. Contact pad 318-2 is coupled to a second input voltage terminal 340 for winding 306 using an electrical trace 338 and two vias (500 in FIG. 5). As further shown, contact pad 332-1 is coupled to a first output voltage terminal 352 for winding 308 using a via 500. Contact pad 332-2 is coupled to a second output voltage terminal 354 for winding 308 using an electrical trace 346 and a via 500. The vias 500 are formed in metal layer 326 through the isolation material 314.

By reference to FIGS. 3 and 4, contact pads 316 and 318 are used to flip chip mount IC 310 onto mounting surface 400. Namely, contact pads 334 (one of four labeled) on a surface of IC 310 are mechanically and electrically coupled to contact pads 316, for instance using solder balls (not shown) that may be attached to the contact pads 334. Contact pads 336 also on the surface of IC 310 are mechanically and electrically coupled to contact pads 318, for instance using solder balls (not shown) that may be attached to the contact pads 336. The coupling between contact pads 318 and 336 allows circuitry, such as a bridge circuit, on the IC 310 to be electrically coupled to the primary winding 306 of transformer 304.

Additionally, contact pads 330 and 332 are used to flip chip mount IC 320 onto mounting surface 400. Namely, contact pads 342 (one of four labeled) on a surface of IC 320 are mechanically and electrically coupled to contact pads 330, for instance using solder balls (not shown) that may be attached to the contact pads 342. Contact pads 344 also on the surface of IC 320 are mechanically and electrically coupled to contact pads 332, for instance using solder balls (not shown) that may be attached to the contact pads 344. The coupling between contact pads 332 and 344 allows circuitry, such as a bridge circuit, on the IC 320 to be electrically coupled to the secondary winding 308 of transformer 304. In another example, instead of flip chip mounting, ICs 310 and 320 are mounted to the surface 400 of circuit support structure 302 using bond wires.

As further illustrated in FIGS. 3 and 4, windings 306 and 308 of transformer 304 partially overlap. As such, at least a portion of each of the windings 306 and 308 is non-overlapping. Accordingly in this example, and as shown by reference to FIG. 4, a portion of winding 306 to the left of dotted line 402 is non-overlapping. Also, a portion of winding 308 to the right of dotted line 404 is non-overlapping. Having partially overlapping windings 306 and 308 allows IC 310 to be electrically coupled to winding 306 and IC 320 to be electrically coupled to winding 308 without the use of bond wires. The elimination of bond wires in IC package 300, through the use of partially overlapping windings 306 and 308 and flip chip mounting, allows reduced interconnection parasitics, e.g., reduced parasitic inductance, in the package. This mitigates including one or more large decoupling capacitors within the IC package 300 or within a system that contains the IC package 300.

As shown in FIGS. 3 and 5, elements of the circuit support structure 302, which are associated with the transformer 304 and with coupling the transformer 304 to ICs 310 and 320, can be formed in two metal layers. Namely, winding 306, electrical trace 346, and IC contact pads 316, 318, 330, and 332 are formed in the top metal layer 328. Moreover, winding 308 and electrical trace 338 are formed in metal layer 324. The spacing between the metal layers 328 and 324 from removing metal layer 326 (except for its use in vias 350 and 500) allows for a vertical isolation separation of windings 306 and 308, in an example, of 105 micrometers or less while maintaining a voltage isolation of 2.5 kV RMS for 60 seconds.

Figure 6:
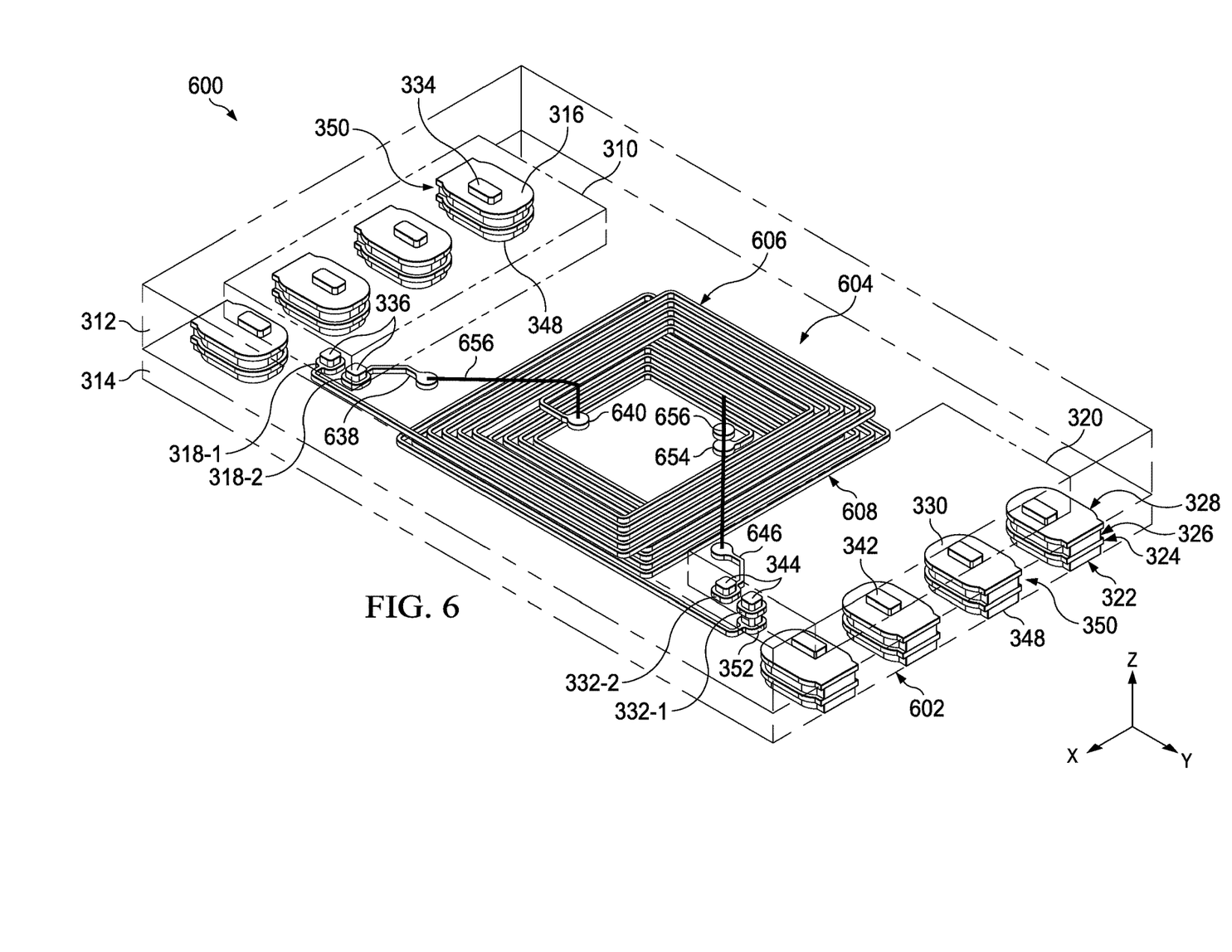
FIG. 6 is an isometric view of another example IC package having integrated isolation circuitry including an inductive channel coupled within the IC package using wire bonding.
Figure 7:
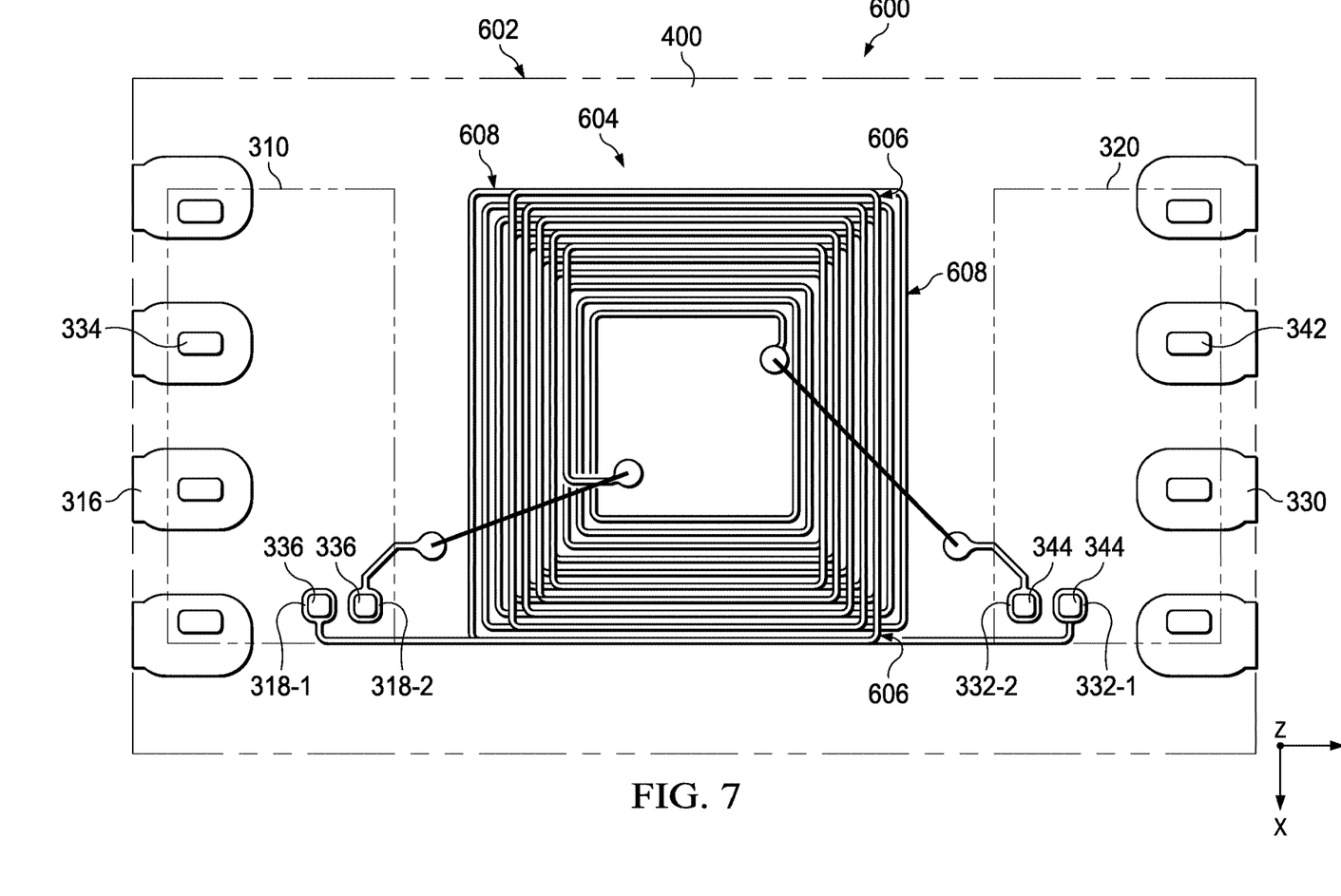
FIG. 7 is a top down plan view of the example IC package shown in FIG. 6.
Figure 8:
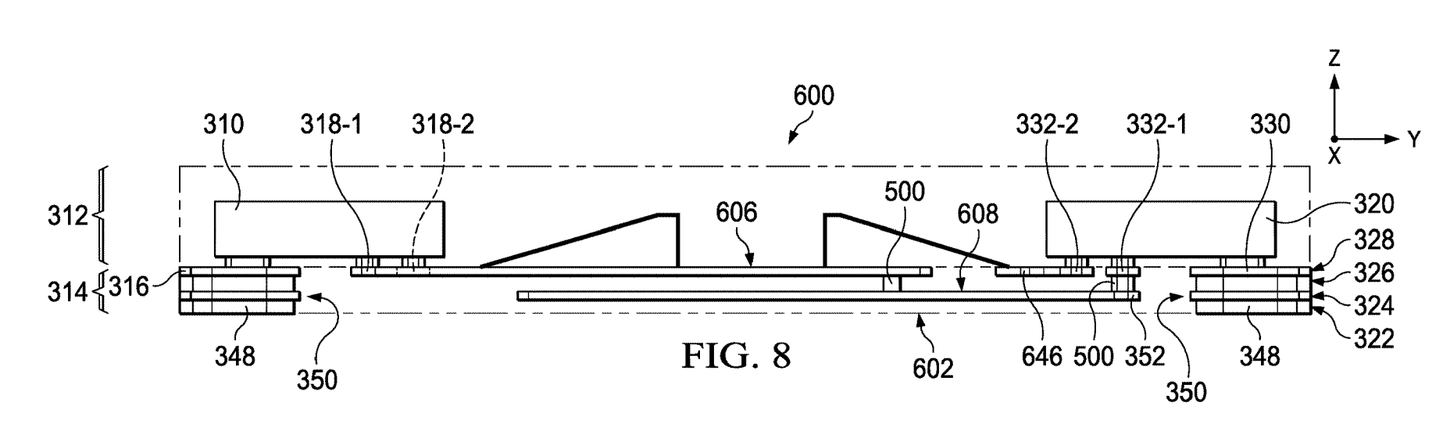
FIG. 8 is a side view of the example IC package shown in FIG. 6.

FIGS. 6-8 illustrate different views of another example IC package 600 having integrated isolation circuitry 604, according to this description. More particularly, FIG. 6 is an isometric view of IC package 600 along XYZ axes. FIG. 7 is a top down plan view of IC package 600 along the XY axes, and FIG. 8 is a side view of IC package 600 along the YZ axes.

As illustrated, IC package 600 includes a circuit support structure 602 and two ICs 310 and 320 mounted to a surface (400 in FIG. 7) of the circuit support structure 602. The circuit support structure 602 includes isolation circuitry 604 integrated therein. IC package 600 is similar in some respects to IC package 300, as represented by the common reference numbers between FIGS. 3 and 6. However, circuit support structure 602 of IC package 600 differs from circuit support structure 302 of IC package 300 in the design of the single transformer of isolation circuitry 604, also referred to herein as transformer 604. Moreover, circuit support structure 602 differs from circuit support structure 302 in how contact pads 318 and 332 are coupled to transformer 604 as compared how contact pads 318 and 332 are coupled to transformer 304.

More particularly, similarly to IC package 300, contact pad 318-1 forms a first input voltage terminal for a winding 606 of transformer 604. By contrast, however, contact pad 318-2 is electrically coupled to a second input voltage terminal 640 of winding 606 using both an electrical trace 638 and a bond wire 656. Additionally, similarly to IC package 300, contact pad 332-1 is coupled to a first output voltage terminal 352 for a winding 608 of transformer 604 using a via (500 in FIG. 8). By contrast, however, contact pad 332-2 is electrically coupled to a second output voltage terminal 654 of winding 608 using an electrical trace 646, a bond wire 656, and a via 500.

FIG. 7 illustrates that ICs 310 and 320 are similarly flip chip mounted to a surface 400 of circuit support structure 602 as they are to the surface 400 of circuit support structure 302. By contrast, however, windings 606 and 608 of transformer 604 fully overlap. Namely, as shown, outer borders of winding 606 are fully contained within or align with outer borders of winding 608.

Also, as shown in FIGS. 6 and 8, elements of the circuit support structure 602, which are associated with the transformer 604 and coupling the transformer 604 to ICs 310 and 320, can be formed in two metal layers. Namely, winding 606, electrical traces 638 and 646, and contact pads 316, 318, 330, and 332 are formed in the top metal layer 328. Moreover, winding 308 is formed in metal layer 324.

By comparison to IC package 300, the use of bond wires 656 may increase the parasitic inductance in IC package 600. However, the fully overlapping windings 606 and 608 may allow the transformer 604 to occupy a smaller area on the circuit support structure 602, thereby allowing a smaller size for IC package 600 over IC package 300. Moreover, the transformer 604 arrangement illustrated in FIGS. 6-8 allows an increase in the transformer 604 coupling. This, resultantly, allows high power transfer and higher DC-DC efficiency as compared to the transformer 304 arrangement illustrated in FIGS. 3-5.

Figure 9:
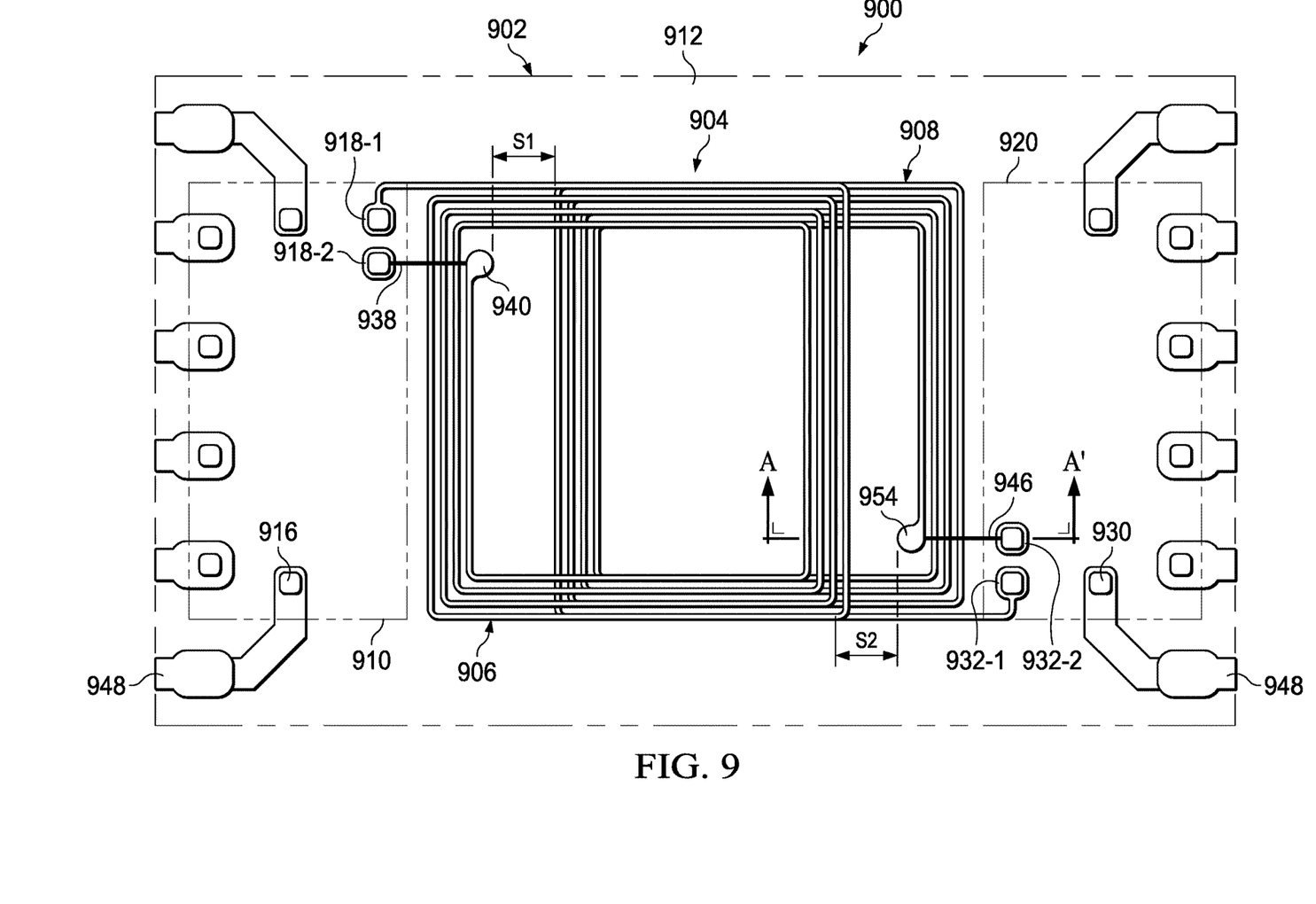
FIG. 9 is a top down plan view depicting another example IC package having integrated isolation circuitry including an inductive channel coupled within the IC package without the use of wire bonding.
Figure 10:
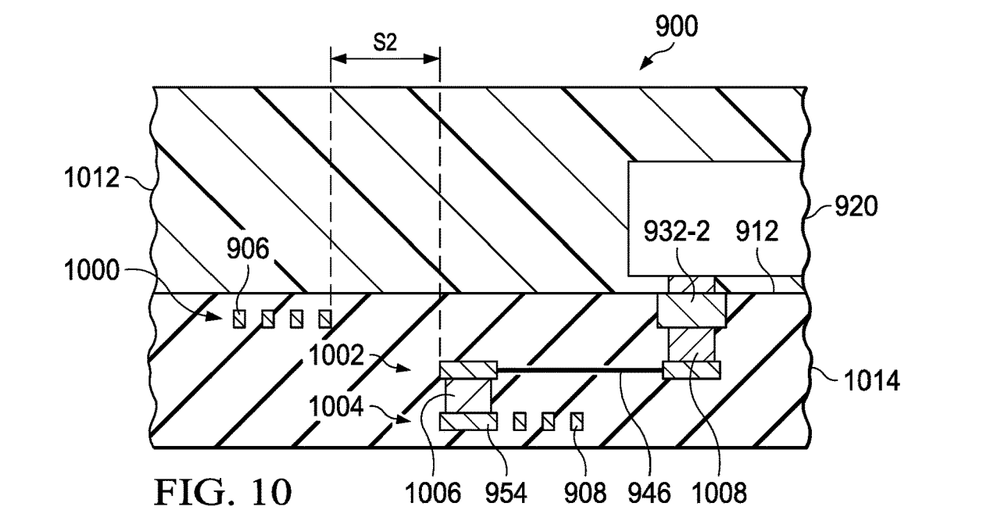
FIG. 10 is a partial cross-sectional view taken from the example IC package shown in FIG. 9.
Figure 11:
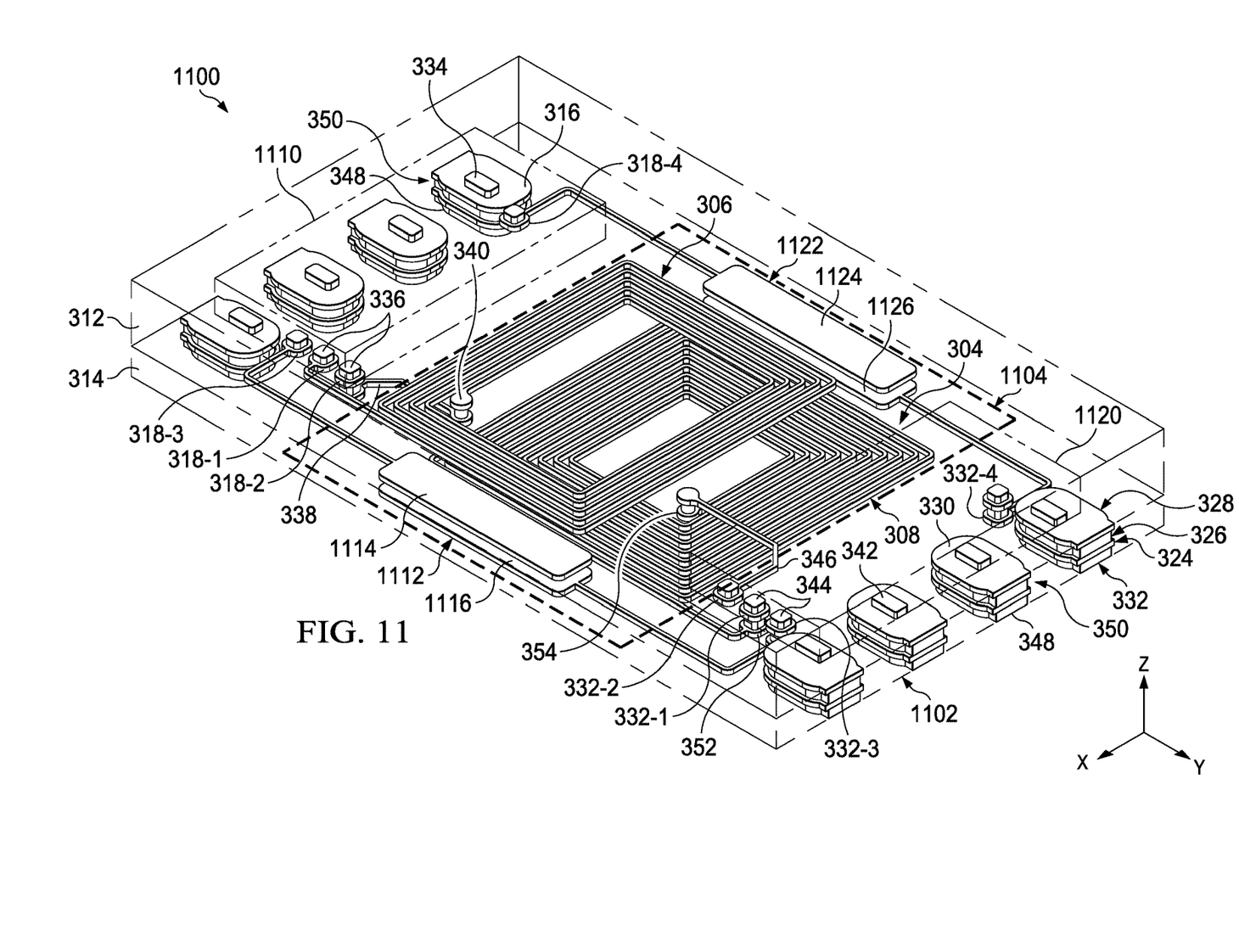
FIG. 11 is an isometric view of another example IC package having integrated isolation circuitry including inductive and capacitive isolation channels.

FIGS. 9-10 illustrate different views of another example IC package 900 having integrated isolation circuitry 904, according to this description. More particularly, FIG. 9 is a top down plan view of IC package 900, and FIG. 10 is a partial cross-sectional view taken at dashed line AA' through IC package 900.

As illustrated, IC package 900 includes a circuit support structure 902 and two ICs 910 and 920 mounted to a surface 912 of the circuit support structure 902. In an example, IC 910 includes driver circuitry and a primary side bridge circuit, and IC 920 includes a secondary side bridge circuit and driver/output voltage regulation circuitry, for instance as described previously by reference to FIG. 2. IC package 900 further includes a mold compound (1012 of FIG. 10) that encapsulates the ICs 910 and 920 and the surface 912 of the circuit support structure 902. The mold compound 1012 may have any suitable form such as a bulk mold compound, a sheet mold compound, an insulation build-up film, etc.

The circuit support structure 902 is constructed to include multiple metal layers (e.g., 1000-1004 of FIG. 10) and isolation material (1014 of FIG. 10) containing or encapsulating the metal layers 1000-1004. In an example, the circuit support structure 902 is constructed to include four metal layers, although only three are shown in FIG. 10. The fourth metal layer may have formed therein contacts pads 948 to couple the IC package 900 to an external circuit support structure such as a PCB and may also have formed therein a thermal/ground pad. In other examples, IC package 900 may be constructed from more or fewer than four metal layers. Metal layers 1000-1004 are positioned in substantially parallel planes to one another and are substantially planar within allowable tolerances as defined by the technology used to make the circuit support structure 902. Any suitable metal may be used to form the metal layers 1000-1004, such as copper.

Isolation material 1014 is used to electrically isolate the metal layers 1000-1004 and may, thereby, include a dielectric or insulator. Isolation material 1014 fully contains some of the metal layers 1000-1004 and partially contains other of the metal layers 1000-1004. Moreover, isolation material 1014 defines a mounting or top surface 912 and an opposing or bottom surface (not shown) to the mounting surface 912. In an example, isolation material 1014 is a mold compound having any suitable form such as a bulk mold compound, a sheet mold compound, an insulation build-up film, etc., and may be or include the same or a different type of mold compound as mold compound 1012. In a particular example, the isolation material 1014 is composed of ABF.

As further illustrated in FIG. 9, the circuit support structure 902 also includes isolation circuitry 904, which is formed and integrated therein. In this example, isolation circuitry 904 includes a single transformer having a winding 906 (e.g., a primary winding) as a first circuit element and a winding 908 (e.g., a secondary winding) as a second circuit element. Accordingly, isolation circuitry 904 is also referred to herein as transformer 904. As further shown, windings 906 and 908 of transformer 904 partially overlap.

Windings 906 and 908 are formed in different ones of the metal layers 1000-1004 as further described below and illustrated by reference to FIG. 10. Moreover, windings 906 and 908 are electrically isolated using the isolation material 1014 of the circuit support structure 902, which in one particular example forms a galvanic isolation barrier between two different power domains used to separately power ICs 910 and 920.

The circuit support structure 902 includes a first plurality of IC contact pads 916 (one of six labeled) and 918 (individually referred to as contact pads 918-1 and 918-2) for coupling to IC 910. In an example, IC contact pads 916 and 918 are used to flip chip mount IC 910 onto mounting surface 912, for instance using contact pads and solder balls (not shown) coupled to a surface of IC 910. The circuit support structure 902 further includes a second plurality of IC contact pads 930 (one of six labeled) and 932 (individually referred to as contact pads 932-1 and 932-2) for coupling to IC 920. In an example, IC contact pads 930 and 932 are used to flip chip mount IC 920 onto mounting surface 912, for instance using contact pads and solder balls (not shown) coupled to a surface of IC 920.

In this example, the IC contact pads 916, 918, 930, and 932 are formed in metal layer 1000 (e.g., a top metal layer) and are exposed at mounting surface 912 of the circuit support structure 902 to couple to ICs 910 and 920. In another example, instead of flip chip mounting, ICs 910 and 920 are mounted to the surface 912 of circuit support structure 902 using bond wires.

Contact pads 916 and 930 are electrically coupled to contacts pads 948 (two of twelve labeled), which are formed in a bottom metal layer (not shown) and exposed at a bottom surface (not shown) of the circuit support structure 902. In an example, the mounting surface 912 and the opposing bottom surface are substantially flat or planar and are substantially parallel to one another within allowable tolerances of the technology used to make the circuit support structure 902. The electrical coupling between contact pads 916 and 948 and between contact pads 930 and 948 may be implemented using vias (not shown) formed in intervening metal layers 1002 and 1004 and formed through the isolation material 1014. Accordingly, contact pads 948 may be used to mount and electrically couple IC package 900 to an external circuit support structure, such as a laminate PCB.

Contact pads 918 and 932 are electrically coupled to transformer 904. As shown, contact pad 918-1 forms a first input voltage terminal for winding 906. Contact pad 918-2 is coupled to a second input voltage terminal 940 for winding 906 using an electrical trace 938 and two vias (not shown), since the electrical trace 938 is formed in a different metal layer than winding 906. When IC 910 is mounted to circuit support structure 902, a mechanical and electrical coupling between contact pads 918 and contact pads (not shown) on a surface of IC 910 allows circuitry, e.g., a bridge circuit, on IC 910 to be electrically coupled to winding 906.

As further shown, contact pad 932-1 is coupled to a first output voltage terminal (not labeled) for winding 908 using a via (not shown), since the contact pad 932-1 and winding 908 are formed in different metal layers. Contact pad 932-2 is coupled to a second output voltage terminal 954 for winding 908 using an electrical trace 946 and vias (1006 and 1008 of FIG. 10) through the isolation material 1014. When IC 920 is mounted to circuit support structure 902, a mechanical and electrical coupling between contact pads 932 and contact pads (not shown) on a surface of IC 920 allows circuitry, e.g., a bridge circuit, on IC 920 to be electrically coupled to winding 908.

As partially shown in FIGS. 9 and 10, elements of the circuit support structure 902, which are associated with the transformer 904 and with coupling the transformer 904 to ICs 910 and 920, are formed in three metal layers in this example. Namely, winding 906 and contact pads 916, 918, 930, and 932 are formed in the top metal layer 1000, and winding 908 is formed in metal layer 1004. However, electrical trace 938 (which couples contact pad 918-2 to winding 906) and electrical trace 946 (which couples contact pad 932-2 to winding 908) are formed in metal layer 1002, which is between metal layers 1000 and 1004.

Forming the electrical traces, e.g., 938 and 946, in a third metal layer instead of the two metal layers in which the contact pads 916, 918, 930, and 932 and windings 906 and 908 are formed allows greater control over creating the critical separation, e.g., distances S1 and S2, between windings 906 and 908 to meet a desired voltage isolation rating. As illustrated, S1 is the distance between metal layers 1002 and 1004, and S2 is the distance between metal layers 1000 and 1002. S1 and S2 may be two of many separations that exist within an IC package, such as the IC package 900, which are controlled to achieve a desired isolation rating or performance.

FIG. 11 is an isometric view of another example IC package 1100 having integrated isolation circuitry 1104. As illustrated, IC package 1100 includes a circuit support structure 1102 and two ICs 1110 and 1120 mounted to a surface (not shown) of the circuit support structure 1102. The circuit support structure 1102 includes isolation circuitry 1104 integrated therein. IC package 1100 is similar in some respects to IC package 300, as represented by the common reference numbers between FIGS. 3 and 11. However, IC package 1100 differs from IC package 300 in the design of the ICs 1110 and 1120 as compared to ICs 310 and 320. IC package 1100 also differs from IC package 300 in the design of the isolation circuitry 1104 and its coupling to ICs 1110 and 1120 as compared to the isolation circuitry 304 and its coupling to ICs 310 and 320.

Namely, in an example, ICs 210 and 220 shown in and described by reference to FIG. 2 are representative of ICs 1110 and 1120. Accordingly, IC 1110 is a primary side IC, which includes driver circuitry, a primary side bridge circuit, and a digital communicator. IC 1120 is a secondary side IC, which includes a secondary side bridge circuit, driver/output voltage regulation circuitry, and a digital communicator.

Moreover, in contrast to isolation circuitry 304 of IC package 300, isolation circuitry 1104 of IC package 1100 not only includes the transformer 304 as an isolation circuit but also includes two additional isolation circuits, capacitors 1112 and 1122. Each of the capacitors 1112 and 1122 has two circuit elements (in this case two plates) formed in the metal layers 322-328. Namely, capacitor 1112 includes a plate 1114 (e.g., a top plate) and a plate 1116 (e.g., a bottom plate), which is electrically isolated from plate 1114 by the isolation material 314. Capacitor 1122 includes a plate 1124 (e.g., a top plate) and a plate 1126 (e.g., a bottom plate), which is electrically isolated from plate 1124 by the isolation material 314.

As illustrated, and to reduce the height of IC package 1100, top plates 1114 and 1124 are formed in the same metal layer 328 as winding 306. Moreover, bottom plates 1116 and 1126 are formed in the same metal layer 324 as winding 308. In another example, parts or all of the capacitors 1112 and/or 1122 can be formed in one or more different metal layers than transformer 304. An advantage of embedding the isolation capacitors 1112 and 1122 in the circuit support structure 1102 of IC package 1100 using a technology such as using routable lead frame technology is that the capacitors 1112 and 1122 can be floating with respect to the (external) contact pads 348, which connect to an external circuit such as a PCB. As compared to other IC package solutions where, for example, the capacitor structures are mounted on the circuit support structure along with the ICs requiring additional bond wiring to external contact pins or pads, the IC package 1100 allows greater flexibility in the electrical coupling of isolation circuitry 1104. Additionally, the capability of electrically connecting the capacitors 1112 and 1122 without the additional bond wires allows for a reduction in parasitic capacitances. Reduced parasitic capacitances may improve the signal-to-noise ratio and power consumption over the capacitive channels.

Also, in this example, capacitors 1112 and 1122 are vertical plate capacitors with the plates formed parallel to top and bottom surfaces of the circuit support structure 1102. However, in another example, one or both of capacitors 1112 and 1122 can be a lateral plate capacitor with each plate formed in one or more of the layers 322-328 and parallel to sides of the circuit support structure 1102. In other examples, each circuit element of the capacitors 1112 and 1122 can have multiple connected plates, for instance as with a finger or fringe capacitor.

Also, in contrast to circuit support structure 302, circuit support structure 1102 includes an additional two contact pads 318-3 and 318-4 in the first plurality of IC contact pads, for electrically coupling circuitry on IC 1110 to isolation circuitry 1104. Circuit support structure 1102 also includes an additional two contact pads 332-3 and 332-4 in the second plurality of IC contact pads, for electrically coupling circuitry on IC 1120 to isolation circuitry 1104. As shown, contact pad 318-3 is coupled to plate 1114 of capacitor 1112. Contact pad 318-4 is coupled to plate 1124 of capacitor 1122. Contact pad 332-3 is coupled to plate 1116 of capacitor 1112. Contact pad 332-4 is coupled to plate 1126 of capacitor 1122.

Accordingly, when IC 1110 is flip chip mounted to the circuit support structure 302, contact pads 336 (two of four labeled) on the surface of IC 1110 are mechanically and electrically coupled to contact pads 318-3 and 318-4, for instance using solder balls (not shown) that may be attached to contact pads 336. The coupling between contact pads 336 and 318-3, 318-4 allows circuitry, such as a digital communicator on the IC 1110 to be electrically coupled to the top plates of capacitors 1112 and 1122 to facilitate bilateral data communication.

When IC 1120 is flip chip mounted to the circuit support structure 302, contact pads 344 (two of four labeled) on the surface of IC 1120 are mechanically and electrically coupled to contact pads 332-3 and 332-4, for instance using solder balls (not shown) that may be attached to contact pads 344. The coupling between contact pads 344 and 332-3, 332-4 allows circuitry, such as a digital communicator on the IC 1120 to be electrically coupled to the bottom plates of capacitors 1112 and 1122 to facilitate bilateral data communication.

As with IC package 300, elements of the circuit support structure 1102, which are associated with the isolation circuitry 1104 and with coupling the isolation circuitry 1104 to ICs 1110 and 1120, can be formed in two metal layers. Namely, winding 306, plates 1114 and 1124, electrical trace 346, and contact pads 316, 318, 330, and 332 are formed in the top metal layer 328. Moreover, winding 308, plates 1116 and 1126, and electrical trace 328 are formed in metal layer 324.

Figure 12:
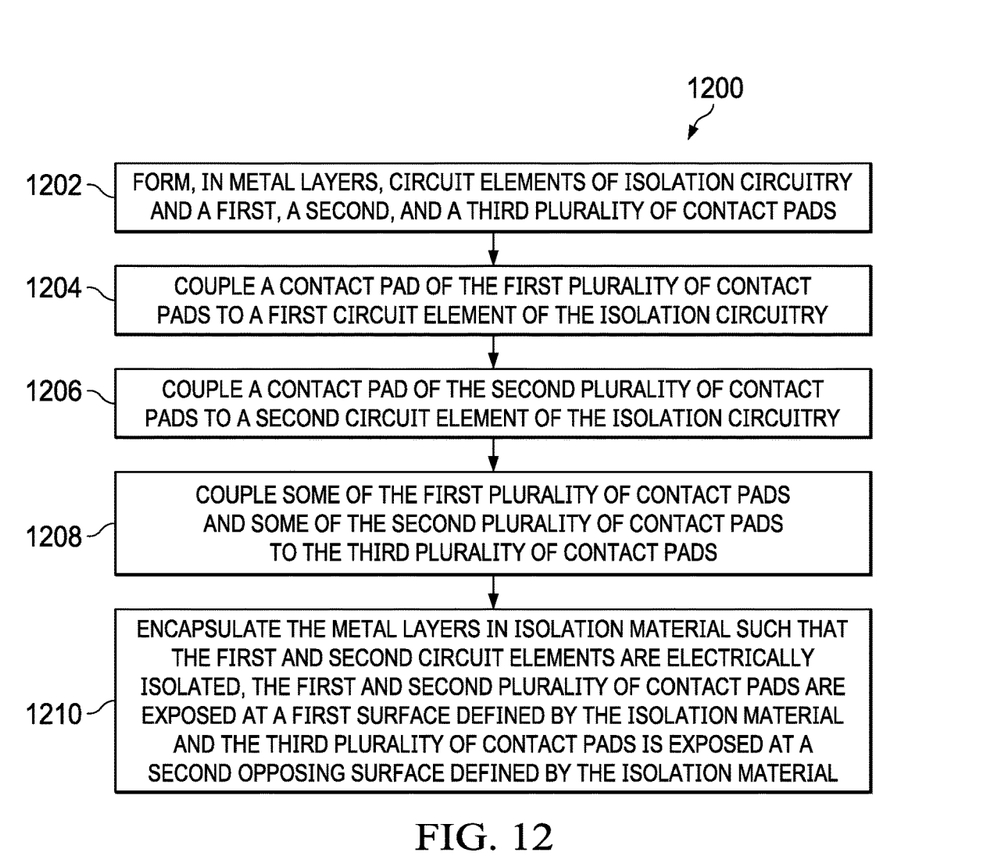
FIG. 12 is a flowchart of an example method for making a circuit support structure having integrated isolation circuitry.

FIG. 12 is a flowchart including blocks 1202-1210 depicting an example method 1200 for making a circuit support structure having integrated isolation circuitry, for example a circuit support structure 302, 602, 902, or 1102. However, by way of a particular example, method 1200 is described within the context of making the circuit support structure 302 of FIG. 3. Blocks 1202-1210 of method 1200 need not be performed in the order illustrated in the flowchart. Moreover, method 1200 may be implemented using routable lead frame technology and may be performed as part of a process for manufacturing IC packages, such as IC packages 300, 600, 900, or 1100.

Block 1202 depicts forming metallic elements of a circuit support structure in multiple metal layers, such as multiple copper layers. These metallic elements include a first, a second, and a third plurality of contact pads and at least first and second circuit elements of isolation circuitry, such as windings of a transformer, plates of a capacitor, or both. In an example, the first plurality of (IC) contact pads are used to electrically and mechanically couple to a first IC mounted to the circuit support structure. The second plurality of (IC) contact pads are used to electrically and mechanically couple to a second IC mounted to the circuit support structure. The third plurality of (external) contact pads are used to mount and electrically couple the circuit support structure to an external structure, such as a PCB.

More particularly, in making the circuit support structure 302 four metal layers 322-328 are used. In accordance with block 1202, windings 306 and 308 of isolation circuit (transformer) 304, a first plurality of contact pads 316 and 318, a second plurality of contact pads 330 and 332, and a third plurality of contact pads 348 are formed in two metal layers 324 and 328 of the four metal layers 322-328.

Block 1204 depicts coupling a contact pad of the first plurality of contact pads to a first circuit element of the isolation circuitry. Accordingly, in making circuit support structure 302, contact pads 318 are coupled to winding 306. Namely, contact pad 318-1 is formed as one voltage input terminal of winding 306. Moreover, electrical trace 338 is formed in metal layer 324, and two vias 500 are formed in metal layer 326 to couple contact pad 318-2 to the other voltage input terminal 340 of winding 306.

Block 1206 depicts coupling a contact pad of the second plurality of contact pads to a second circuit element of the isolation circuitry. Accordingly, in making circuit support structure 302, contact pads 332 are coupled to winding 308. Namely, a via 500 is formed in metal layer 326 to couple contact pad 332-1 to one voltage output terminal 352 of winding 308. Moreover, electrical trace 346 is formed in metal layer 324, and a via 500 is formed in metal layer 326 to couple contact pad 332-2 to the other voltage output terminal 354 of winding 308.

Block 1208 depicts coupling some of the first plurality of contact pads and some of the second plurality of contact pads to the third plurality of contact pads. Accordingly, in making circuit support structure 302, vias 350 are formed in metal layers 325 and 326 to couple contact pads 316 of the first plurality of contact pads and contact pads 330 of the second plurality of contact pads to the third plurality of contact pads 348.

Block 1210 depicts encapsulating the metal layers in isolation material such that the first and second circuit elements are electrically isolated from each other, the first plurality of contact pads and the second plurality of contact pads are exposed at a first surface defined by the isolation material, and the third plurality of contact pads is exposed at a second opposing surface defined by the isolation material. Accordingly, in making circuit support structure 302, metal layers 322-328 are encapsulated in isolation material 314, e.g., a mold compound such as ABF. Once encapsulated, the isolation material 314 defines a (top/mounting) surface 400 and a (bottom/opposing) surface that is substantially parallel to the mounting surface 400. Metal layer 328, or portions thereof, is exposed at the mounting surface 400, including in this example the contact pads 316, 318, 330, 332, the winding 306 and the electrical trace 346. Metal layer 322, or portions thereof, is exposed at the opposing surface, including in this example contact pads 348. Accordingly, the IC 310 and 320 can be mounted to the circuit support structure 302 and an overmold material 312 added to complete the IC package 300.

Modifications are possible in the described embodiments, and other embodiments are possible, within the scope of the claims.

What is claimed is:
1. An apparatus, comprising:
   a circuit support structure including:
      a metal layer including a metal segment having first and second ends;
      an isolation material that surrounds the metal segment;
      first and second contact pads on a first side of the circuit support structure, the first and second contact pads coupled to the respective first and second ends of the metal segment;

a third contact pad on the first side of the circuit support structure;
a fourth contact pad on a second side of the circuit support structure opposite to the first side; and
a via coupled between the third and fourth contact pads; and
an integrated circuit on the circuit support structure, in which the integrated circuit includes:
a surface facing the first, second, and third contact pads; and
interconnects coupled between the surface and the first, second, and third contact pads.

2. The apparatus of claim 1, wherein the isolation material includes a mold compound.

3. The apparatus of claim 1, wherein the integrated circuit is flip chip mounted to the circuit support structure via the interconnects and the first and second contact pads.

4. The apparatus of claim 1, wherein the circuit support structure and the integrated circuit form a flat no-leads package.

5. The apparatus of claim 1, wherein the metal layer is a first metal layer, the metal segment is a first metal segment, the via is a first via, and the circuit support structure further includes:
a second metal layer including a second metal segment having third and fourth ends, in which the second metal segment is surrounded by the isolation material, and the isolation material isolates between the first and second metal segments;
fifth and sixth contact pads on the first side of the circuit support structure, the fifth and sixth contact pads coupled to the respective third and fourth ends of the second metal segment;
a seventh contact pad on the first side of the circuit support structure;
an eighth contact pad on the second side of the circuit support structure; and
a second via coupled between the fifth and sixth contact pads.

6. The apparatus of claim 1, wherein the metal segment is a first metal segment, and the metal layer further includes a second metal segment coupled between the first metal segment and the first contact pad.

7. The apparatus of claim 1, further comprising a bond wire coupled between the first contact pad and the metal segment.

8. The apparatus of claim 1, wherein at least a part of the integrated circuit is outside a footprint of the metal segment.

9. The apparatus of claim 1, wherein the metal segment forms a winding.

10. The apparatus of claim 1, wherein the metal segment is a first metal segment, and the metal layer includes a second metal segment forming a terminal of a capacitor.

11. The apparatus of claim 1, wherein the metal layer is a first metal layer, the metal segment is a first metal segment, and the apparatus further includes a second metal layer including a second metal segment, the second metal segment coupled between an end of the first metal segment and the second contact pad.

12. The apparatus of claim 5, wherein:
the first and second metal segments form a transformer or a capacitor.

13. The apparatus of claim 5, wherein the integrated circuit is a first integrated circuit, the surface is a first surface, and the apparatus further comprises a second integrated circuit including:
a second surface facing the fifth, sixth, and seventh contact pads; and
second interconnects coupled between the second surface and the fifth, sixth, and seventh contact pads.

14. The apparatus of claim 5, wherein winding is a first winding, and the second metal segment forms a second winding.

15. The apparatus of claim 8, wherein the integrated circuit is entirely outside the footprint of the metal segment.

16. The apparatus of claim 10, wherein at least a part of the integrated circuit is outside a footprint of the second metal segment.

17. The apparatus of claim 10, wherein the metal layer is a first metal layer, the terminal is a first terminal, and the apparatus further includes:
a second metal layer including a third metal segment, the third metal segment forming a second terminal of the capacitor; and
a fifth contact, pad on the first or second sides of the circuit support structure, the fifth contact pad coupled to the third metal segment.

18. The apparatus of claim 13, wherein at least a part of the second integrated circuit is outside a footprint of the second metal segment.

19. The apparatus of claim 18, wherein the second integrated circuit is entirely outside the footprint of the second metal segment.

* * * * *